(12) United States Patent
Tay

(10) Patent No.: US 7,612,817 B2
(45) Date of Patent: Nov. 3, 2009

(54) CMOS IMAGE SENSOR WITH NOISE CANCELLATION

(76) Inventor: Hiok Nam Tay, 6 Mount Vernon, Irvine, CA (US) 92620

( * ) Notice: Subject to any disclaimer, the term of this patent is extended or adjusted under 35 U.S.C. 154(b) by 620 days.

(21) Appl. No.: 10/868,407

(22) Filed: Jun. 14, 2004

(65) Prior Publication Data

US 2004/0233312 A1      Nov. 25, 2004

Related U.S. Application Data

(63) Continuation of application No. 10/183,218, filed on Jun. 26, 2002, now Pat. No. 6,795,117.

(60) Provisional application No. 60/333,216, filed on Nov. 6, 2001, provisional application No. 60/338,465, filed on Dec. 3, 2001, provisional application No. 60/345,672, filed on Jan. 5, 2002.

(51) Int. Cl.
H04N 5/335        (2006.01)
(52) U.S. Cl. .................................. 348/308; 250/208.1
(58) Field of Classification Search ......... 348/294–310; 250/208.1
See application file for complete search history.

(56) References Cited

U.S. PATENT DOCUMENTS 6,522,357 B2 *   2/2003   Beiley et al. ................ 348/296

2002/0051257 A1 *   5/2002   Okui et al. .................. 358/514

FOREIGN PATENT DOCUMENTS

EP          1143708 A1     10/2001
JP       2000-165754 A1      6/2000

OTHER PUBLICATIONS

EPO Supplementary Search Report for U.S. Appl. No. EP 02 78 2274, a related application to this application.

* cited by examiner

*Primary Examiner*—Sinh Tran
*Assistant Examiner*—Anthony J Daniels
(74) *Attorney, Agent, or Firm*—Irell & Manella, LLP

(57) ABSTRACT

An image sensor that has one or more pixels within a pixel array. The pixel array may be coupled to a control circuit and one or more subtraction circuits. The control circuit may cause each pixel to provide a first reference output signal and a reset output signal. The control circuit may then cause each pixel to provide a light response output signal and a second reference output signal. The light response output signal corresponds to the image that is to be captured by the sensor. The subtraction circuit may provide a difference between the reset output signal and the first reference output signal to create a noise signal that is stored in memory. The subtraction circuit may also provide a difference between the second reference output signal and the light response output signal to create a normalized light response output signal. The noise signal may then be subtracted from the normalized light response output signal to generate the output data of the sensor. The second reference output signal is the same as the first reference output signal so that the process in essence subtracts the reset noise from the light response signal.

29 Claims, 16 Drawing Sheets

CMOS IMAGE SENSOR WITH NOISE CANCELLATION

CROSS REFERENCE TO RELATED APPLICATIONS

This application is a continuation application claiming priority to U.S. patent application Ser. No. 10/183,218, filed Jun. 26, 2002, which now U.S. Pat. No. 6,795,117, claims priority under 35 U.S.C. §119(e) to provisional Application No. 60/333,216, filed on Nov. 6, 2001; provisional application No. 60/338,465, filed on Dec. 3, 2001 and provisional application No. 60/345,672 filed on Jan. 5, 2002.

BACKGROUND OF THE INVENTION

1. Field of the Invention

The subject matter disclosed generally relates to the field of semiconductor image sensors.

2. Background Information

Photographic equipment such as digital cameras and digital camcorders contain electronic image sensors that capture light for processing into a still or video image, respectively. There are two primary types of electronic image sensors, charge coupled devices (CCDs) and complimentary metal oxide semiconductor (CMOS) sensors. CCD image sensors have relatively high signal to noise ratios (SNR) that provide quality images. Additionally, CCDs can be fabricated to have pixel arrays that are relatively small while conforming with most camera and video resolution requirements. A pixel is the smallest discrete element of an image. For these reasons, CCDs are used in most commercially available cameras and camcorders.

CMOS sensors are faster and consume less power than CCD devices. Additionally, CMOS fabrication processes are used to make many types of integrated circuits. Consequently, there is a greater abundance of manufacturing capacity for CMOS sensors than CCD sensors.

To date there has not been developed a CMOS sensor that has the same SNR and pixel pitch requirements as commercially available CCD sensors. Pixel pitch is the space between the centers of adjacent pixels. It would be desirable to provide a CMOS sensor that has relatively high SNR while providing a commercially acceptable pixel pitch.

CCD sensors contain pixel arrays that have multiple rows and columns. When capturing first and second images a CCD must read every row from the array for the first image and then every row in the array for the second image. This is a relatively inefficient approach that contains inherent delays in data retrieval. It would be desirable to decrease the time required to retrieve data from the pixel array.

U.S. Pat. No. 5,587,728 issued to Shinohara describes an image sensor with on-board memory. The memory stores signals from the pixel array. There are typically errors associated with storing and retrieving the signals due to noise, drift, etc. The errors can produce invalid data. It would be desirable to provide an on-board memory for an image sensor that does not require a zero noise margin.

BRIEF SUMMARY OF THE INVENTION

An image sensor with a control circuit that causes a pixel to provide a reset output signal and a reference output signal.

DETAILED DESCRIPTION

Disclosed is an image sensor that has one or more pixels within a pixel array. The pixel array may be coupled to a control circuit and one or more subtraction circuits. The control circuit may cause each pixel to provide a first reference output signal and a reset output signal. The control circuit may then cause each pixel to provide a light response output signal and a second reference output signal. The light response output signal corresponds to the image that is to be captured by the sensor.

The subtraction circuit may provide a difference between the reset output signal and the first reference output signal to create a noise signal that is stored in memory. The subtraction circuit may also provide a difference between the light response output signal and the second reference output signal to create a normalized light response output signal. The noise signal may then be subtracted from the normalized light response output signal to generate the output data of the sensor. The second reference output signal is the same as the first reference output signal so that the process in essence subtracts the reset noise from the light response signal.

This, process increases the signal to noise ratio (SNR) of the sensor. The pixel may be a three transistor structure that minimizes the pixel pitch of the image sensor. The entire image sensor is preferably constructed with CMOS fabrication processes and circuits. The CMOS image sensor has the characteristics of being fast, low power consumption, small pixel pitch and high SNR.

Figure 1:
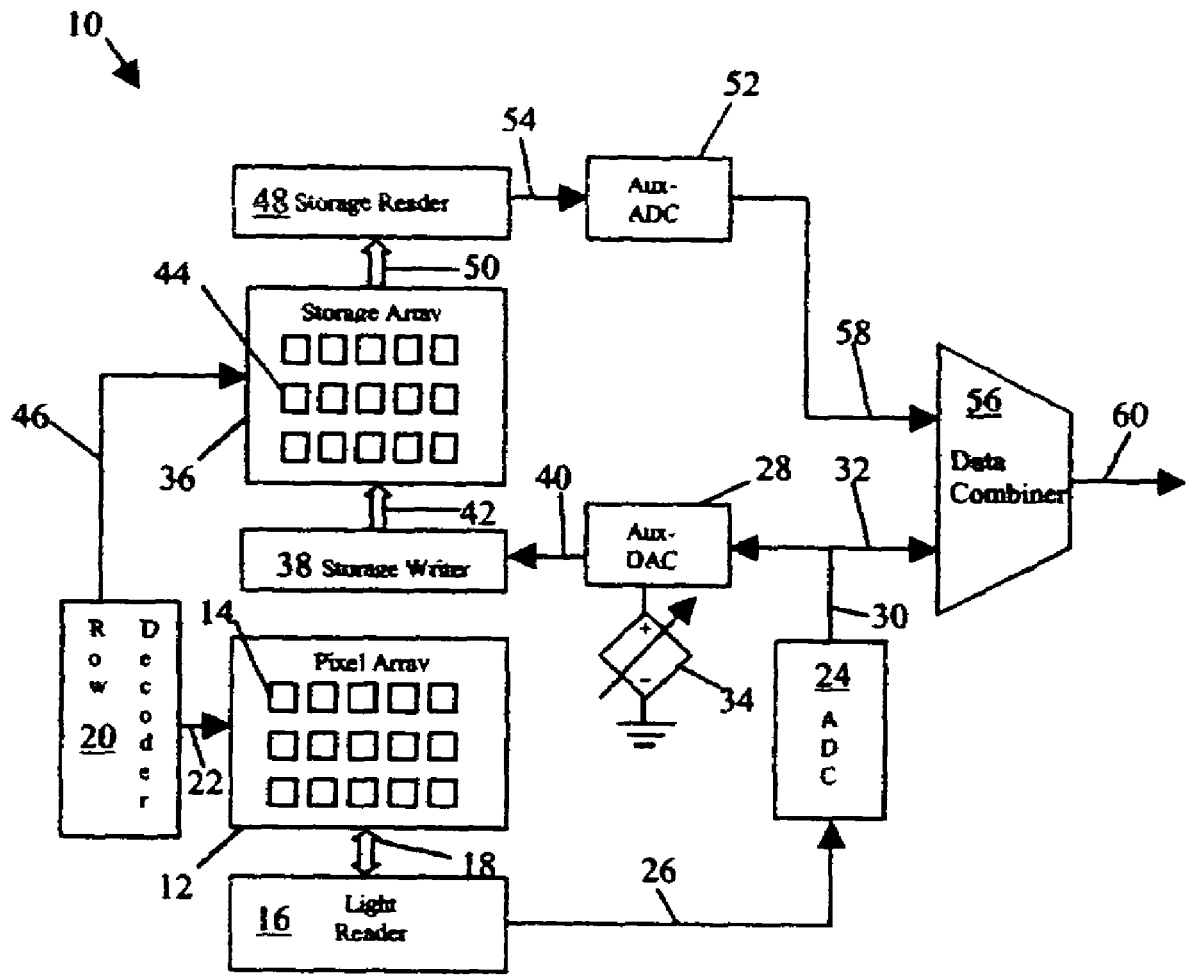
FIG. 1 is a schematic of an embodiment of an image sensor.

Referring to the drawings more particularly by reference numbers, FIG. 1 shows an image sensor 10. The image sensor 10 includes a pixel array 12 that contains a plurality of individual photodetecting pixels 14. The pixels 14 are arranged in a two-dimensional array of rows and columns.

The pixel array 12 is coupled to a light reader circuit 16 by a bus 18 and to a row decoder 20 by control lines 22. The row decoder 20 can select an individual row of the pixel array 12. The light reader 16 can then read specific discrete columns within the selected row. Together, the row decoder 20 and light reader 16 allow for the reading of an individual pixel 14 in the array 12.

The light reader 16 may be coupled to an analog to digital converter 24 (ADC) by output line(s) 26. The ADC 24 generates a digital bit string that corresponds to the amplitude of the signal provided by the light reader 16 and the selected pixels 14.

The ADC 24 is connected to a digital to analog converter 28 (DAC) by busses 30 and 32. The DAC 28 converts the digital bit string back to a single pulse which has an amplitude dependent upon the value of the bit string. The unit step size of the DAC 28 may be set by a reference circuit 34.

The output of the DAC 28 is stored in a memory circuit 36 by a storage writer circuit 38. The storage writer circuit 38 is connected to the DAC 28 by output line(s) 40 and to memory 36 by a bus 42. The memory circuit 36 may contain individual memory cells 44 that are each capable of storing multi-voltage levels.

The memory circuit 36 may be connected to the row decoder 20 by control line(s) 46 that allow the decoder 20 to select individual rows of memory cells 44. The memory circuit 36 may be connected to a storage reader circuit 48 by a bus 50. The storage reader circuit 48 can read individual columns of memory cells 44 located in a row selected by the decoder 20.

The storage reader circuit 48 may be connected to an ADC 52 by control line(s) 54. The ADC 52 generates a digital bit string in accordance with the amplitude of the signal retrieved from memory 36. The ADC 52 may be coupled to a data combiner 56 by a bus 58. The combiner 56 may combine the data on busses 32 and 58 onto an output bus 60. The data on bus 60 may be provided to a processor (not shown). By way of example, the sensor 10 and processor may be integrated into photographic instruments such as a digital camera, a digital camcorder, or a cellular phone unit that contains a camera.

Figure 2:
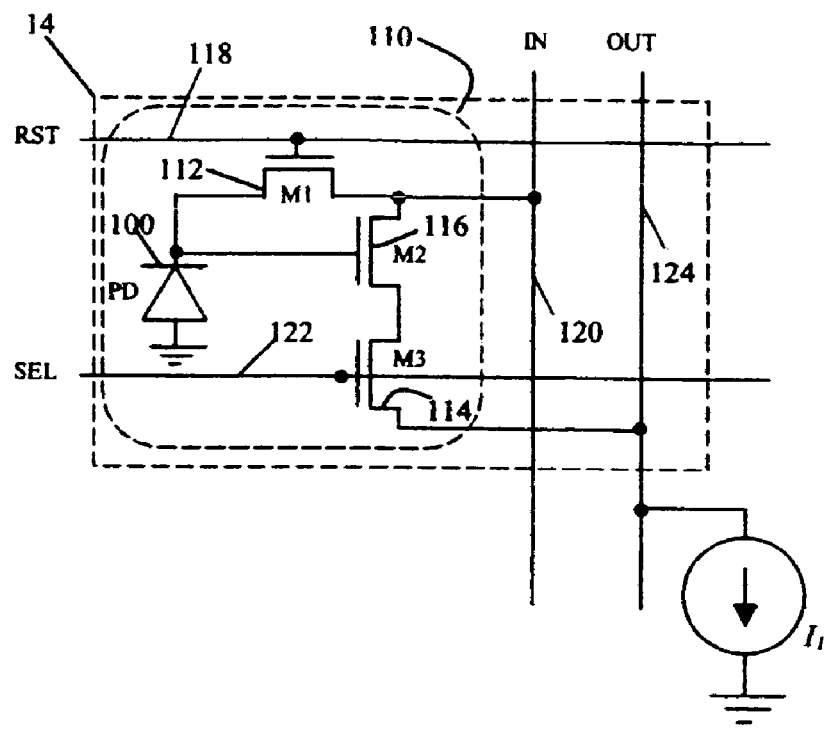
FIG. 2 is a schematic of an embodiment of a pixel of the image sensor.

FIG. 2 shows an embodiment of a cell structure for a pixel 14 of the pixel array 12. The pixel 14 may contain a photodetector 100. By way of example, the photodetector 100 may be a photodiode. The photodetector 100 may be connected to a reset transistor 112. The photodetector 100 may also be coupled to a select transistor 114 through a level shifting transistor 116. The transistors 112, 114 and 116 may be field effect transistors (FETs).

The gate of reset transistor 112 may be connected to a RST line 118. The drain node of the transistor 112 may be connected to IN line 120. The gate of select transistor 114 may be connected to a SEL line 122. The source node of transistor 114 may be connected to an OUT line 124. The RST 118 and SEL lines 122 may be common for an entire row of pixels in the pixel array 12. Likewise, the IN 120 and OUT 124 lines may be common for an entire column of pixels in the pixel array 12. The RST line 118 and SEL line 122 are connected to the row decoder 20 and are part of the control lines 22.

Figure 3:
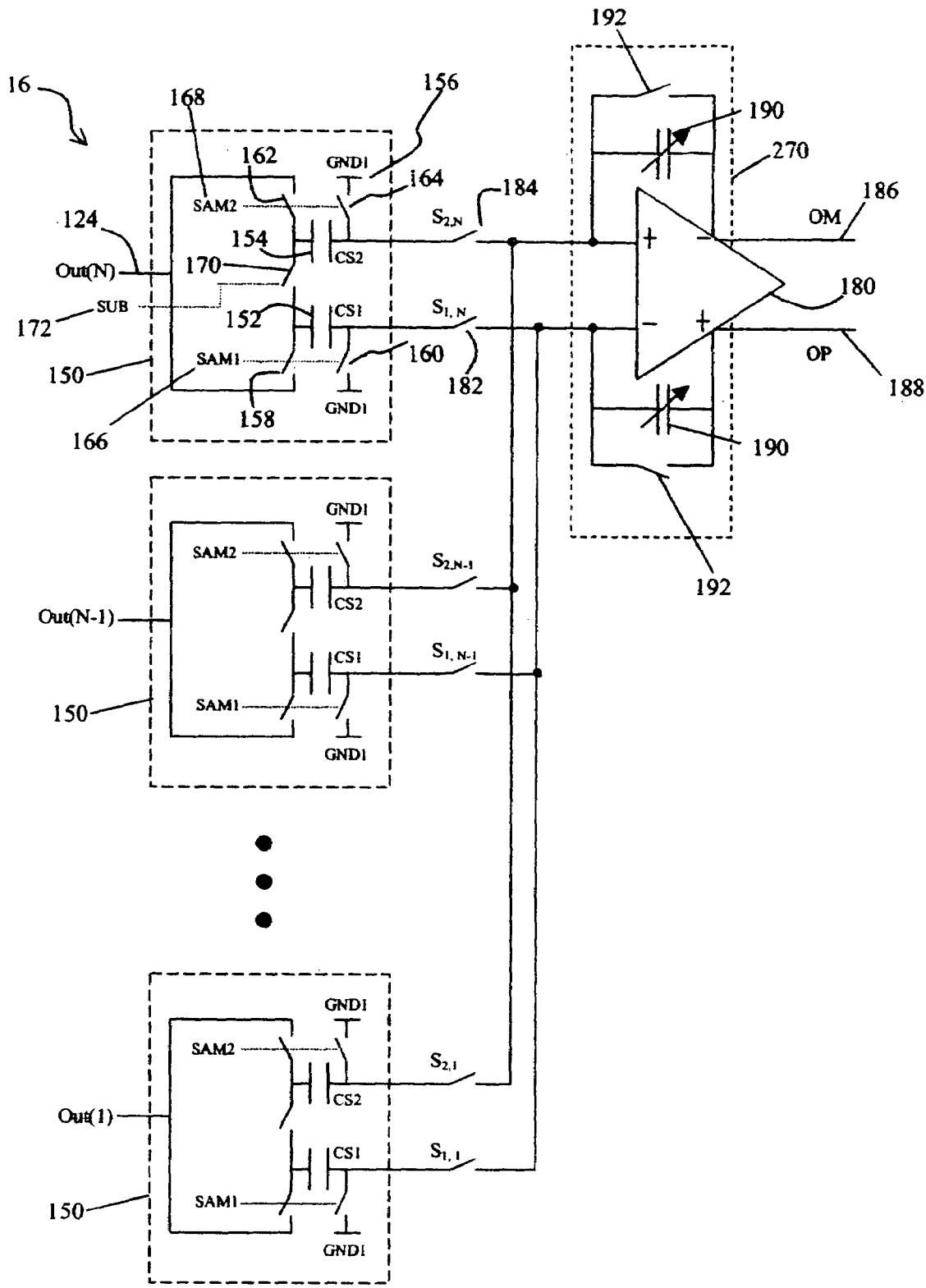
FIG. 3 is a schematic of an embodiment of a light reader circuit of the image sensor.

FIG. 3 shows an embodiment of a light reader circuit 16. The light reader 16 may include a plurality of double sampling capacitor circuits 150 each connected to an OUT line 124 of the pixel array 12. Each double sampling circuit 150 may include a first capacitor 152 and a second capacitor 154. The first capacitor 152 is coupled to the OUT line 124 and ground GND1 156 by switches 158 and 160, respectively. The second capacitor 154 is coupled to the OUT line 124 and ground GND1 by switches 162 and 164, respectively. Switches 158 and 160 are controlled by a control line SAM1 166. Switches 162 and 164 are controlled by a control line SAM2 168. The capacitors 152 and 154 can be connected together to perform a voltage subtraction by closing switch 170. The switch 170 is controlled by a control line SUB 172.

The double sampling circuits 150 are connected to an operational amplifier 180 by a plurality of first switches 182 and a plurality of second switches 184. The amplifier 180 has a negative terminal − coupled to the first capacitors 152 by the first switches 182 and a positive terminal + coupled to the second capacitors 154 by the second switches 184. The operational amplifier 180 has a positive output + connected to an output line OP 188 and a negative output − connected to an output line OM 186. The output lines 186 and 188 are connected to the ADC 24 (see FIG. 1).

The operational amplifier 180 provides an amplified signal that is the difference between the voltage stored in the first capacitor 152 and the voltage stored in the second capacitor 154 of a sampling circuit 150 connected to the amplifier 180. The gain of the amplifier 180 can be varied by adjusting the variable capacitors 190. The variable capacitors 190 may be discharged by closing a pair of switches 192. The switches 192 may be connected to a corresponding control line (not shown). Although a single amplifier is shown and described, it is to be understood that more than one amplifier can be used in the light reader circuit 16.

Figure 4:
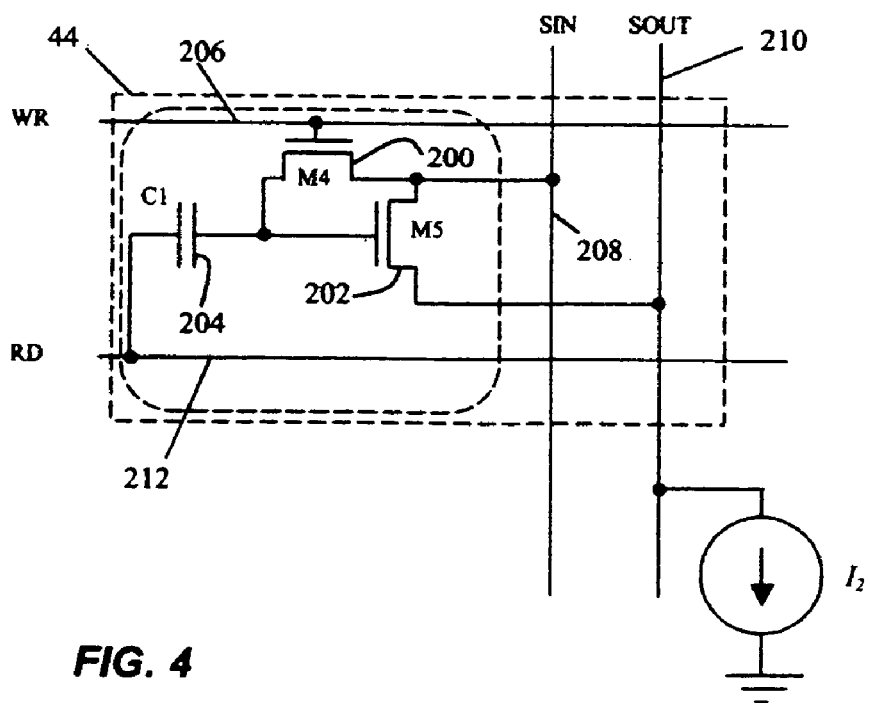
FIG. 4 is a schematic of an embodiment of a memory cell of the image sensor.

FIG. 4 shows an embodiment of a single memory cell 44 of memory 36. Memory 36 has a plurality of memory cells 44 arranged within a two dimensional array that has both rows and columns. Each cell 44 may include a first transistor 200, a second transistor 202 and a capacitor 204. The gate of transistor 200 is connected to a WR control line 206. The drain of transistor 20.0 is connected to an input line SIN 208. The source of transistor 202 is connected to an output line SOUT 210. Capacitor 204 is connected to a RD control line 212, the source node of transistor 200 and the gate of transistor 202. The WR 206 and RD 212 control lines are connected to the row decoder 20 (see FIG. 1). The capacitor 204 stores the analog voltage level of a signal on line SIN 208. The capacitor 204 may be a transistor with the drain and source nodes coupled together.

Converting the analog signal to a digital bit string and then back to an analog signal creates a multi-level analog signal. The signal is "multi-level" because the stored analog signal has a level that corresponds to one of a number of discrete bit strings created by the ADC 24. Storing a multi-level analog signal reduces the number of memory cells required to store the signals from the pixel array 14. Storing multi-level analog signals also provides some immunity to small voltage level drift, particularly within the memory itself.

Figure 5:
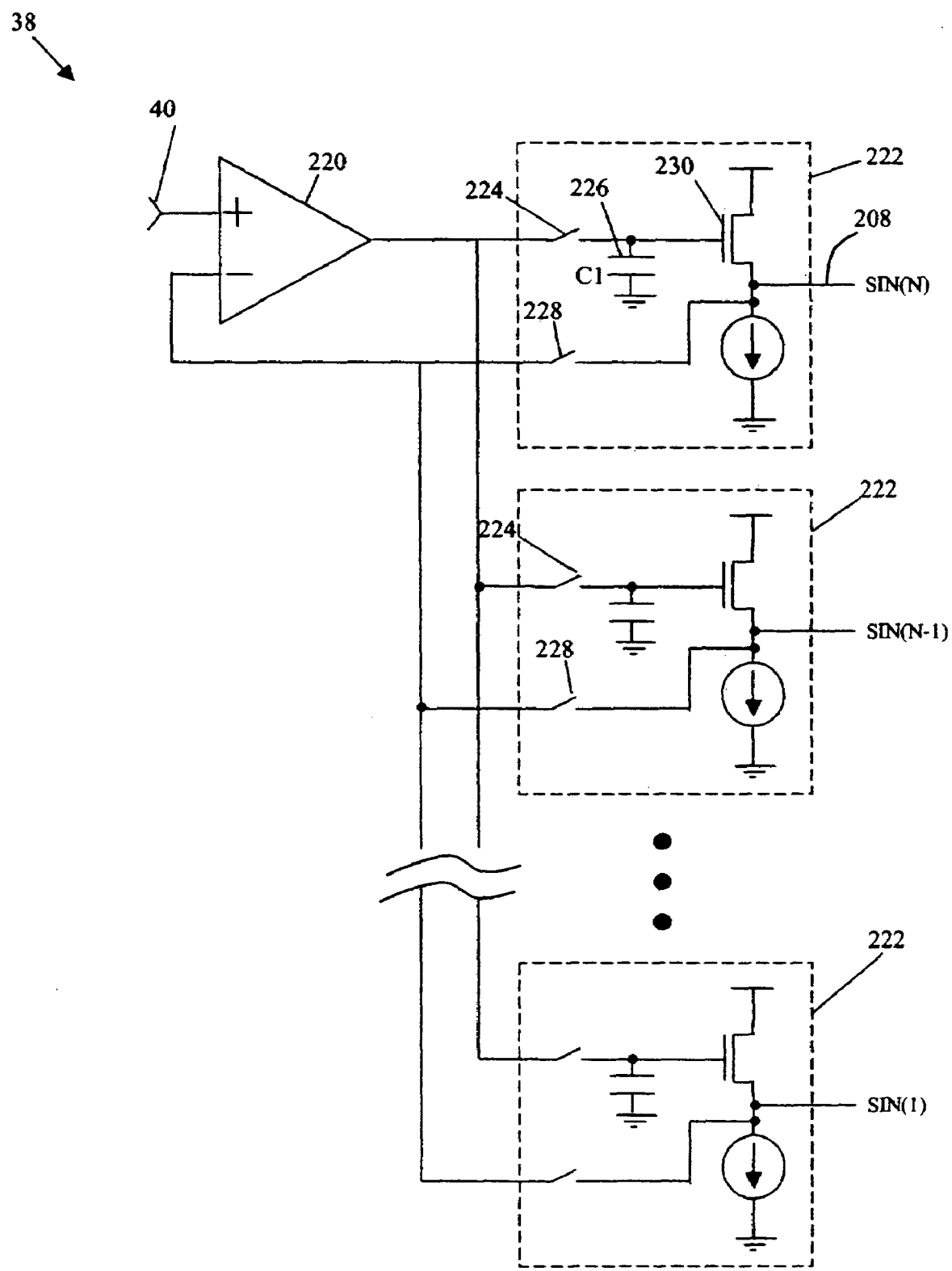
FIG. 5 is a schematic of an embodiment of a storage writer circuit of the image sensor.

FIG. 5 shows an embodiment of a storage writer circuit 38 that writes into the cells 44 of memory 36. The writer circuit 38 may include an amplifier 220 that is coupled to a plurality of column writer circuits 222. The output of each column writer circuit 222 is connected to a corresponding input line SIN 208 of memory 36. Each column writer 222 includes a first switch 224 that can couple a capacitor 226 to an output of the amplifier 220 and a second switch 228 that can couple a negative input − of the amplifier to line SIN 208. The capacitor 226 is coupled to the line SIN 208 by a source follower transistor 230.

The positive terminal + of the amplifier 220 is connected to the output line 40 of the DAC 28. The storage writer circuit 38 stores an analog output of DAC 28 plus the Vgs of source-follower FET 230 into the capacitor 226 for later storage into memory 36. The switches 224 and 228 are closed in a manner to sequentially store the analog outputs in the various column writers 222 of the storage writer circuit.

Figure 6:
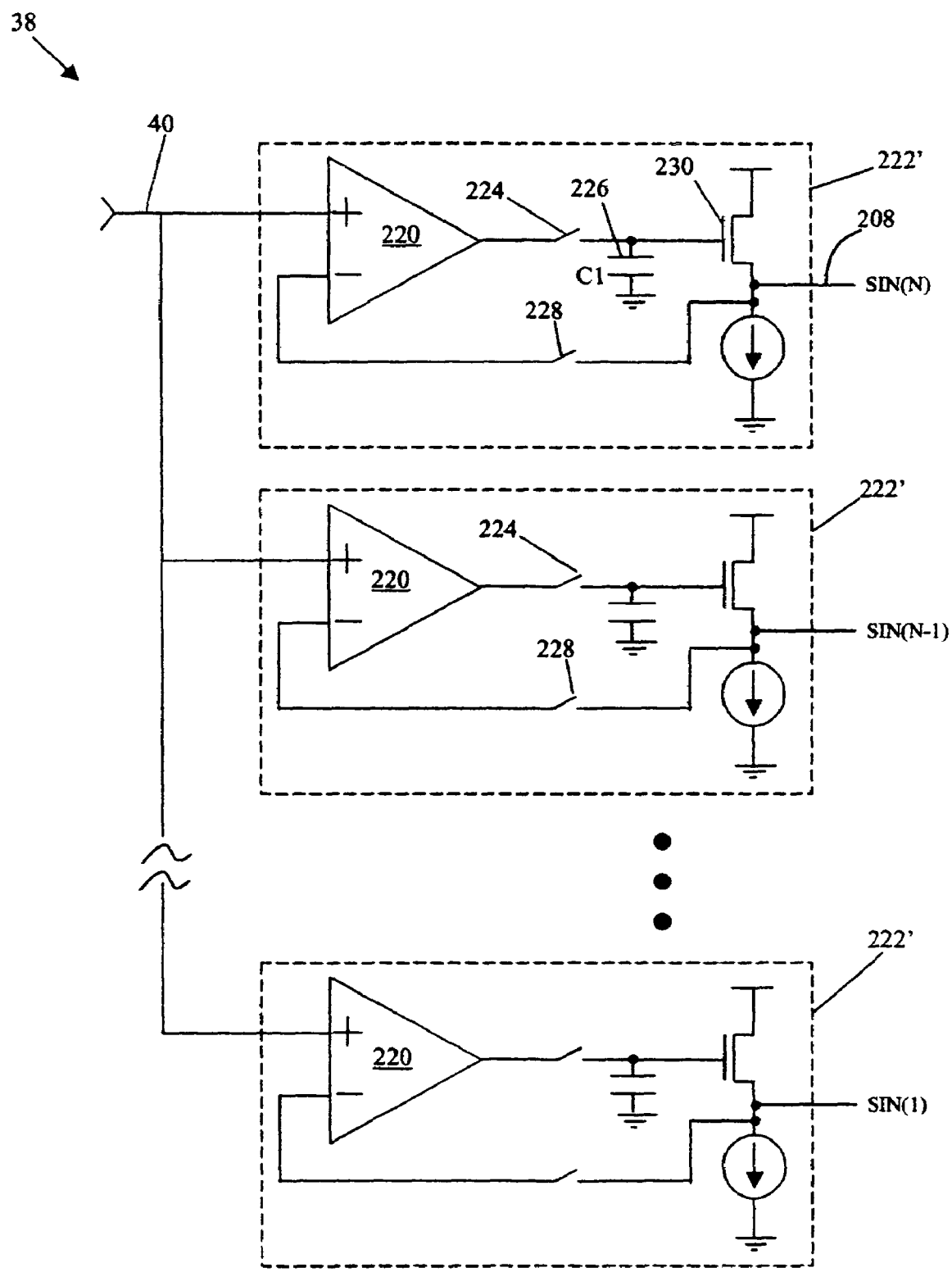
FIG. 6 is a schematic of an alternate embodiment of a storage writer circuit of the image sensor.

FIG. 6 shows an alternate embodiment wherein each column writer circuit 222' contains an amplifier 220 instead of one common amplifier as shown in FIG. 5.

Figure 7:
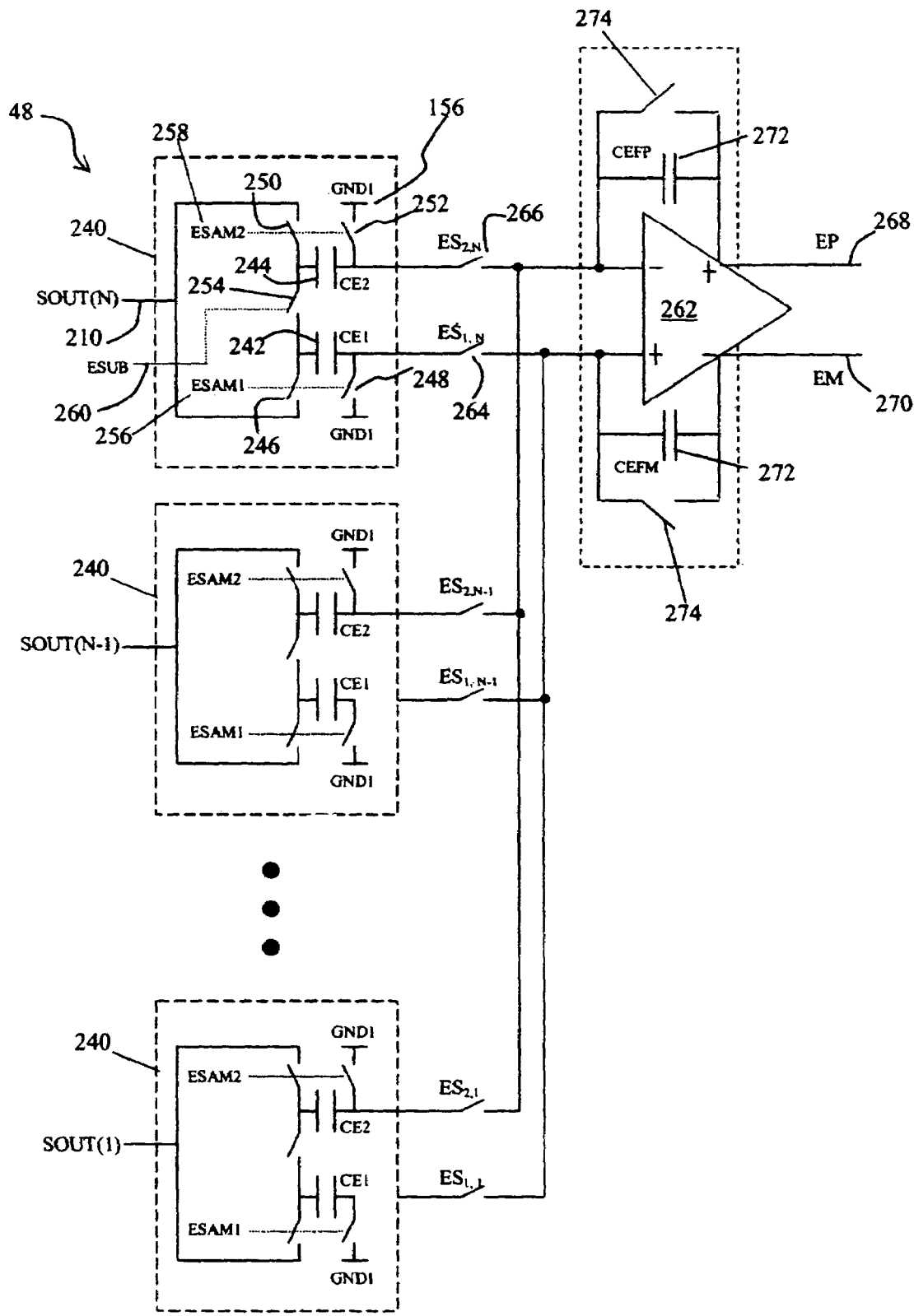
FIG. 7 is a schematic of an embodiment of a storage reader circuit of the image sensor.

FIG. 7 shows an embodiment of a storage reader circuit 48. The reader circuit 48 is similar to the light reader circuit 16. The reader circuit 48 may include a plurality of double sampling capacitor circuits 240 that are each connected to a SOUT line 210 of memory 36. Each double sampling circuit 240 contains a first capacitor 242, a second capacitor 244 and switches 246, 248, 250, 252 and 254. Switches 246 and 248 are controlled by a control line ESAM1 256. Switches 250 and 252 are controlled by a control line ESAM2 258. Switch 254 is controlled by a control line ESUB 260.

The double sampling circuits 240 are connected to an operational amplifier 262 by a plurality of first switches 264 and a plurality of second switches 266. The amplifier 262 has a positive terminal + coupled to the first capacitors 242 by the first switches 264 and a negative terminal − coupled to the second capacitors 244 by the second switches 266. The operational amplifier 262 has a positive output + connected to an output line EP 268 and a negative output − connected to an output line EM 270. The output lines 268 and 270 are part of the control lines 54 connected to the ADC 52 (see FIG. 1).

The operational amplifier 262 provides an amplified signal that is the difference between the voltage stored in the first capacitor 242 and the voltage stored in the second capacitor 244 of a sampling circuit 240 connected to the amplifier 262. The capacitors 272 may be discharged by closing the switches 274. The switches 274 may be connected to a corresponding control line (not shown). Although a single amplifier is shown and described, it is to be understood that more than one amplifier can be used in the storage reader circuit 48.

Figure 8:
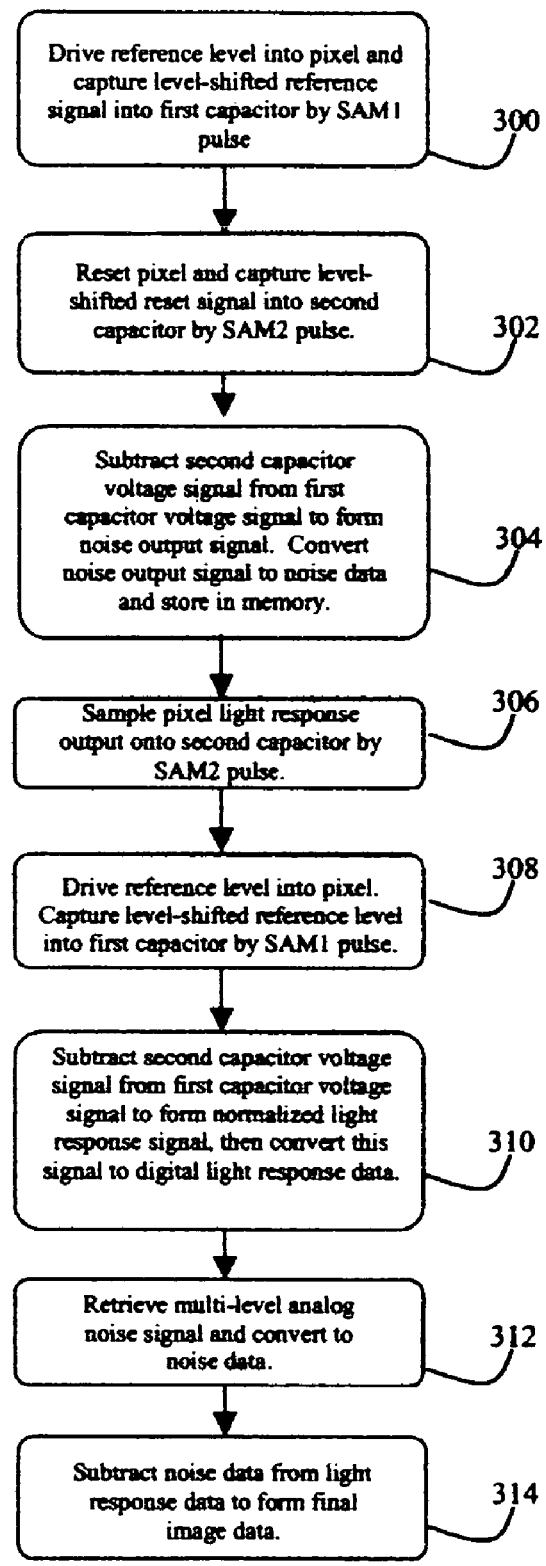
FIG. 8 is a flowchart for a first mode of operation of the image sensor.
Figure 9:
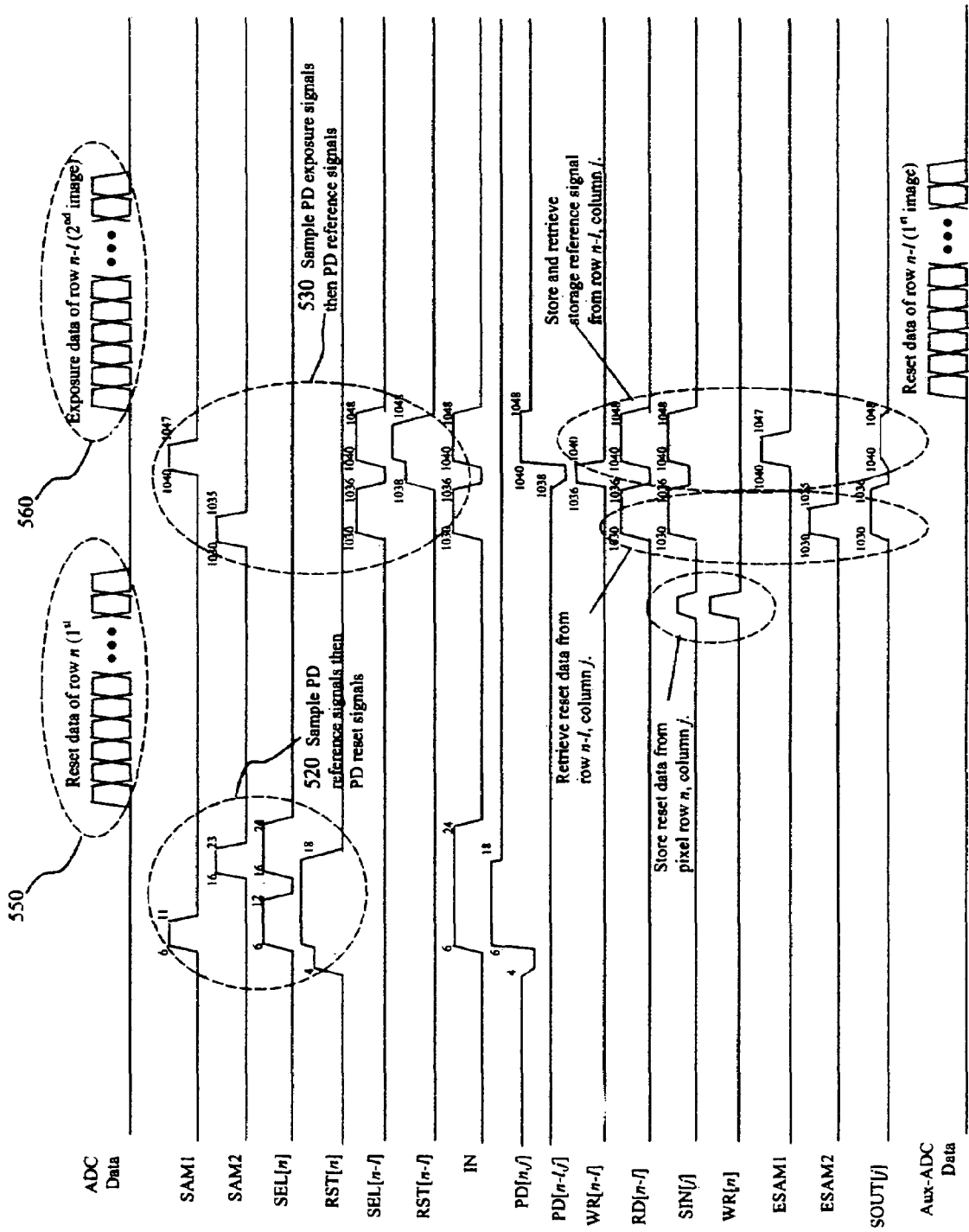
FIG. 9 is a timing diagram for the first mode of operation of the image sensor.

FIGS. 8 and 9 show an operation of the image sensor 10 in a first mode also referred to as a low noise mode. In process block 300 a reference signal is written into each pixel 14 of the pixel array and then a first reference output signal is stored in the light reader. Referring to FIGS. 2 and 9, this can be accomplished by switching the RST 118 and IN 120 lines from a low voltage to a high voltage to turn on transistor 112. The RST line 118 is driven high for an entire row. IN line 120 is driven high for an entire column. In the preferred embodiment, RST line 118 is first driven high while the IN line 120 is initially low.

The RST line 118 may be connected to a tri-state buffer (not shown) that is switched to a tri-state when the IN line 120 is switched to a high state. This allows the gate voltage to float to a value that is higher than the voltage on the IN line 120. This causes the transistor 112 to enter the triode region. In the triode region the voltage across the photodiode 100 is approximately the same as the voltage on the IN line 120. Generating a higher gate voltage allows the photodetector to be reset at a level close to Vdd. CMOS sensors of the prior art reset the photodetector to a level of Vdd−Vgs, where Vgs can be up to 1 V.

During the reset operation, the reset transistor 112 is turned on when the RST signal is high and the IN signal (connected to drain node of reset transistor 112) is also high. This allows a reset current to flow from the drain node to the source node of the reset transistor 112 under the gate of the reset transistor 112. The reset current charges up the photodiode 100, which is connected to the source node of the reset transistor 112.

The RST high voltage may be higher than one threshold voltage above the IN high voltage. In this case, the reset transistor 104 has a continuous inversion layer between the source and drain nodes that may flow in either direction depending on the voltage difference between the source and the drain. In this case, the photodiode 100 is charged up to the same voltage as the IN high voltage.

Alternatively, as is known in the art, the RST high voltage may be lower than one threshold voltage above the IN high voltage, and the inversion layer below the gate of the reset transistor 104 is pinched off near the drain node. In this case, the photodiode 100 is charged up to approximately a voltage which is one threshold below RST high voltage.

The SEL line 122 is also switched to a high voltage level which turns on transistor 114. The voltage of the photodiode 100 is provided to the OUT line 124 through level shifter transistor 116 and select transistor 114. The SAM1 control line 166 of the light reader 16 (see FIG. 3) is selected so that the voltage on the OUT line 124 is stored in the first capacitor 152.

Figure 10:
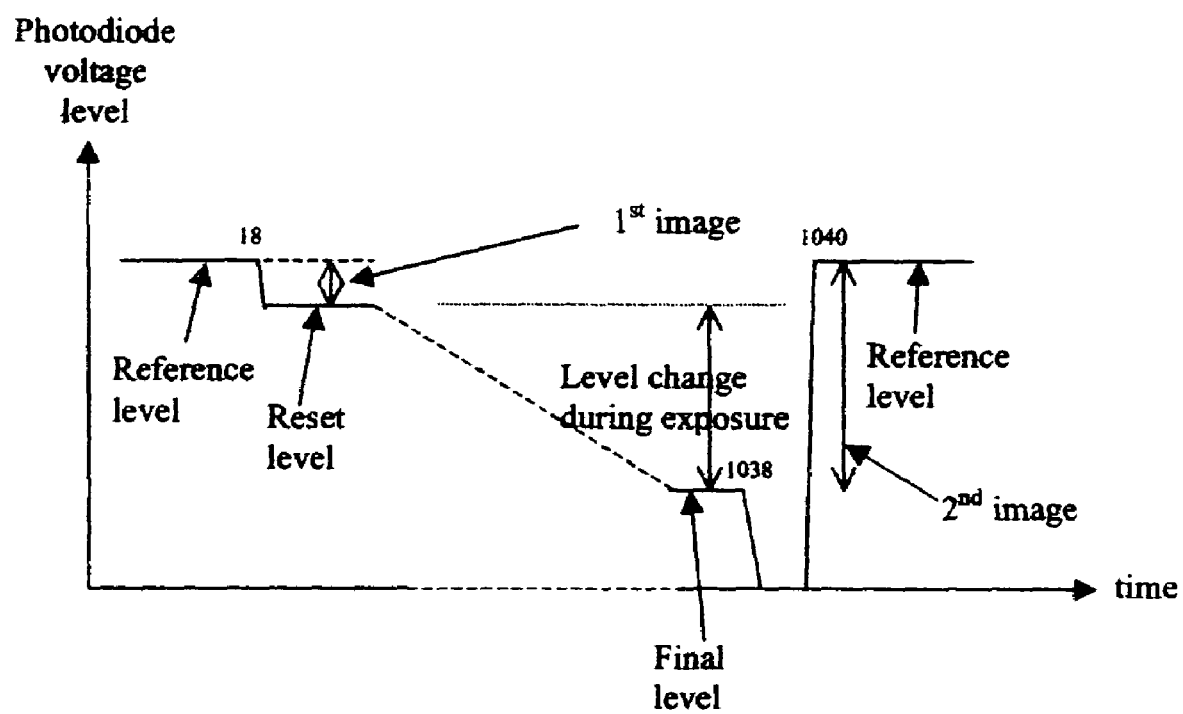
FIG. 10 is a diagram showing the levels of a signal across a photodiode of a pixel.

Referring to FIG. 8, in process block 302 the pixels of the pixel array are then reset and reset output signals are then stored in the light reader 16. Referring to FIGS. 2 and 9 this can be accomplished by driving the RST line 118 low to turn off the transistor 112 and reset the pixel 14. Turning off the transistor 112 will create reset noise, charge injection and clock feedthrough voltage that resides across the photodiode 100. As shown in FIG. 10 the noise reduces the voltage at the photodetector 100 when the transistor 112 is reset.

The SAM2 line 168 is driven high, the SEL line 122 is driven low and then high again, so that a level shifted voltage of the photodiode 100 is stored as a reset output signal in the second capacitor 154 of the light reader circuit 16. Process blocks 300 and 302 are repeated for each pixel 14 in the array 12.

Referring to FIG. 8, in process block 304 the reset output signals are then subtracted from the first reference output signals to create noise output signals that are then stored in memory 36. The noise output signals are provided to the ADC 24, DAC 28 and storage writer 38 for storage into memory 36. Referring to FIGS. 2, 3, 4, 5 and 9, this can be accomplished by closing switches 182, 184 and 170 of the light reader circuit 16 (FIG. 3) to subtract the voltage across the second capacitor 154 from the voltage across the first capacitor 152.

The output of the amplifier 180 is converted to a digital bit string by ADC 24 and then back to an analog signal by DAC 28. Switches 224 and 226 of storage writer circuit 38 are closed and then opened to store the noise signal into the capacitor 226.

To store the noise signal into memory the WR line 206 is driven high and the RD line 212 is driven low to turn on transistor 200 of a memory cell 44 (see FIG. 4). The voltage level of line SIN 208, which is the voltage stored in the capacitor 226 minus Vgs of transistor 230 of the storage writer 38, is such that the transistor 200 operates in the triode region. This allows the capacitor 204 of memory cell 44 to charge to a level that approximates the voltage stored in the capacitor 226 of the storage writer circuit 38 minus the Vgs drop of transistor 230. WR line 206 is then driven low to turn off the transistor 200.

Referring to FIG. 8, in block 306 light response output signals are sampled from the pixels 14 of the pixel array 12 and stored in the light reader circuit 16. The light response output signals correspond to the optical image that is being detected by the image sensor 10. Referring to FIGS. 2, 3 and 9 this can be accomplished by having the IN 120, SEL 122 and SAM2 lines 168 in a high state and RST 118 in a low state. The second capacitor 152 of the light reader circuit 16 stores a level shifted voltage of the photodiode 100 as the light response output signal.

Referring to FIG. 8, in block 308 a second reference output signal is then generated in the pixels 14 and stored in the light reader circuit 16. Referring to FIGS. 2, 3 and 9, this can be accomplished similar to generating and storing the first reference output signal. The RST line 118 is first driven high and then into a tri-state. The IN line 120 is then driven high to cause the transistor 112 to enter the triode region so that the voltage across the photodiode 100 is the voltage on IN line 120. The SEL 122 and SAM2 168 lines are then driven high to store the second reference output voltage in the first capacitor 154 of the light reader circuit 16. Process blocks 306 and 308 are repeated for each pixel 14 in the array 12.

Referring to FIG. 8, in block 310 the light response output signal is subtracted from the second reference output signal to create a normalized light response output signal. The normalized light response output signal is converted into a digital bit string to create light response data. Referring to FIGS. 2, 3 and 9 this can be accomplished by closing switches 170, 182 and 184 of the light reader 16 to subtract the voltage across the first capacitor 152 from the voltage across the second capacitor 154. The difference is then amplified by amplifier 180 and converted into a digital bit string by ADC 24 as light response data.

Referring to FIG. 8, during the generation of the light response output signal, the storage reader circuit 48 reads data from memory 36 in block 312. Referring to FIGS. 4, 7 and 9, this can be accomplished by enabling the RD line 212 of a memory cell and then the ESAM1 line 256 of storage reader circuit 48 so that the noise signal stored in memory 36 is provided to the first capacitor 242 of the storage reader 48.

A storage reference signal is read from the DAC 28, stored in a memory cell 44 and then stored in the second capacitor 244 of the storage reader 48. The voltage across capacitors 242 and 244 are subtracted to create a normalized analog noise signal. The storage reference signal may be the lowest value of the DAC 28 and is subtracted from the stored analog signal to compensate for errors created by the storage write-and-read process.

The ADC 52 converts the normalized analog noise signal into a digital bit string that will be referred to as noise data. Storing the noise signal as a multi-level signal and converting the normalized analog noise signal into discrete digitized levels immunizes the storage and retrieval process from small noise and level drift.

Referring to FIG. 8, in block 314 the combiner 56 subtracts the noise data from the normalized light response data to create image data. The second reference output signal is the same or approximately the same as the first reference output signal such that the present technique subtracts the noise data, due to reset noise, charge injection and clock feedthrough, from the normalized light response-signal. This improves the signal to noise ratio of the final image data. The image sensor performs this noise cancellation with a pixel that has only three transistor. This image sensor thus provides noise cancellation while maintaining a relatively small pixel pitch.

The process described is performed in a sequence across the various rows of the pixels in the pixel array 12 and the memory cells of memory 36. As shown in FIG. 9, the n-th row in the pixel array may be generating noise signals while the n-l-th row generates normalized light response signals, where l is the exposure duration in multiples of a line period.

Figure 11:
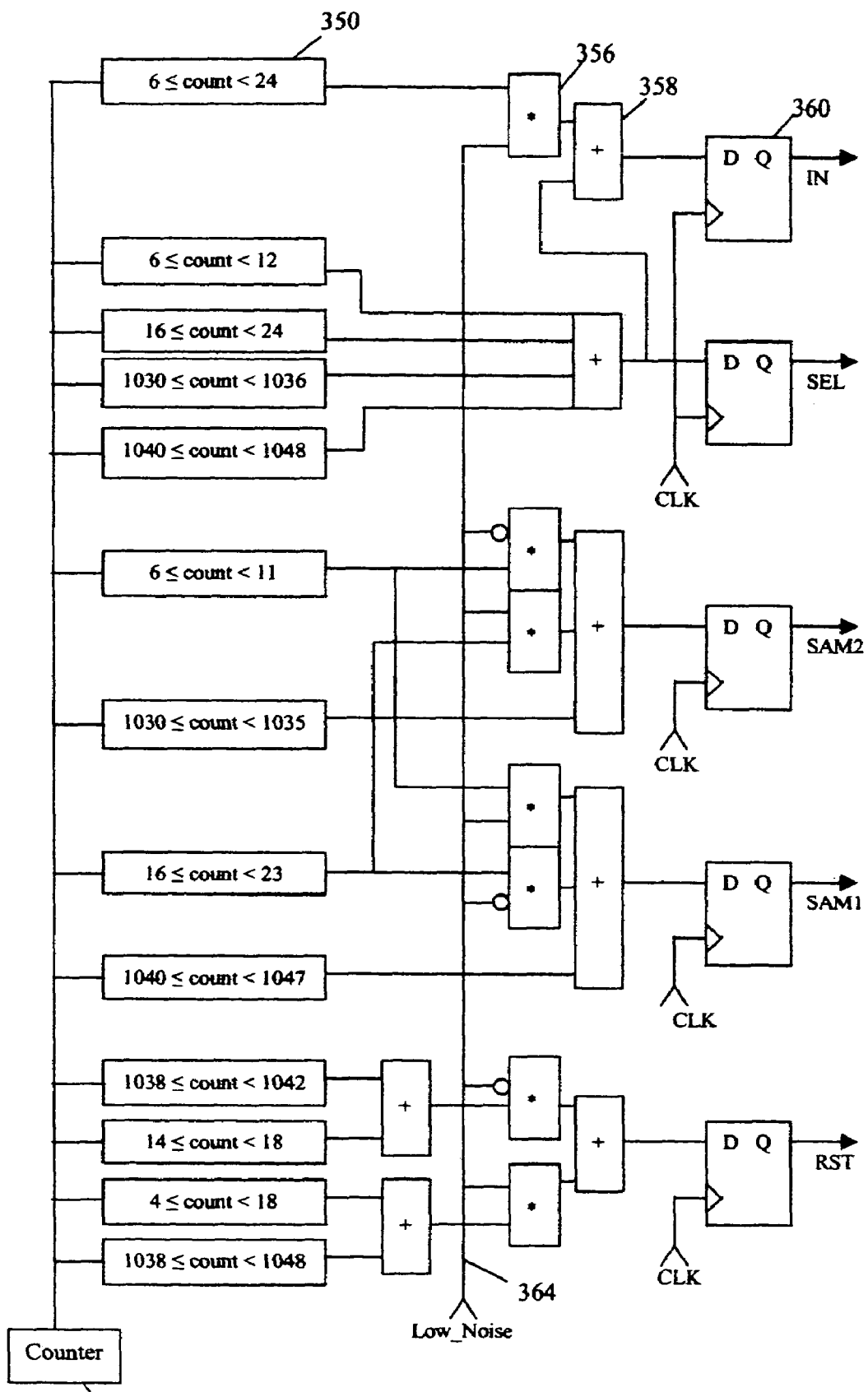
FIG. 11 is a schematic for a logic circuit for generating the timing diagrams of FIG. 9.

The various control signals RST, SEL, IN, SAM1, SAM2, SUB, RD, WR, ESAM1, ESAM2, ESUB can be generated in the circuit generally referred to as the row decoder 20. FIG. 11 shows an embodiment of logic to generate the IN, SEL, SAM1, SAM2 and RST signals in accordance with the timing diagram of FIG. 9. The logic may include a plurality of comparators 350 with one input connected to a counter 352 and another input connected to hardwired signals that contain a lower count value and an upper count value. The counter 352 sequentially generates a count. The comparators 350 compare the present count with the lower and upper count values. If the present count is between the lower and upper count values the comparators 350 output a logical 1.

The comparators 350 are connected to plurality of AND gates 356 and OR gates 358. The OR gates 358 are connected to latches 360. The latches 360 provide the corresponding IN, SEL, SAM1, SAM2 and RST signals. The AND gates 356 are also connected to a mode line 364. To operate in accordance with the timing diagram shown in FIG. 9, the mode line 364 is set at a logic 1.

The latches 360 switch between a logic 0 and a logic 1 in accordance with the logic established by the AND gates 356, OR gates 358, comparators 350 and the present count of the counter 352. For example, the hardwired signals for the comparator coupled to the IN latch may contain a count value of 6 and a count value of 24. If the count from the counter is greater or equal to 6 but less than 24 the comparator 350 will provide a logic 1 that will cause the IN latch 360 to output a logic 1. The lower and upper count values establish the sequence and duration of the pulses shown in FIG. 9. The mode line 364 can be switched to a logic 0 which causes the image sensor to function in a second mode.

Figure 12:
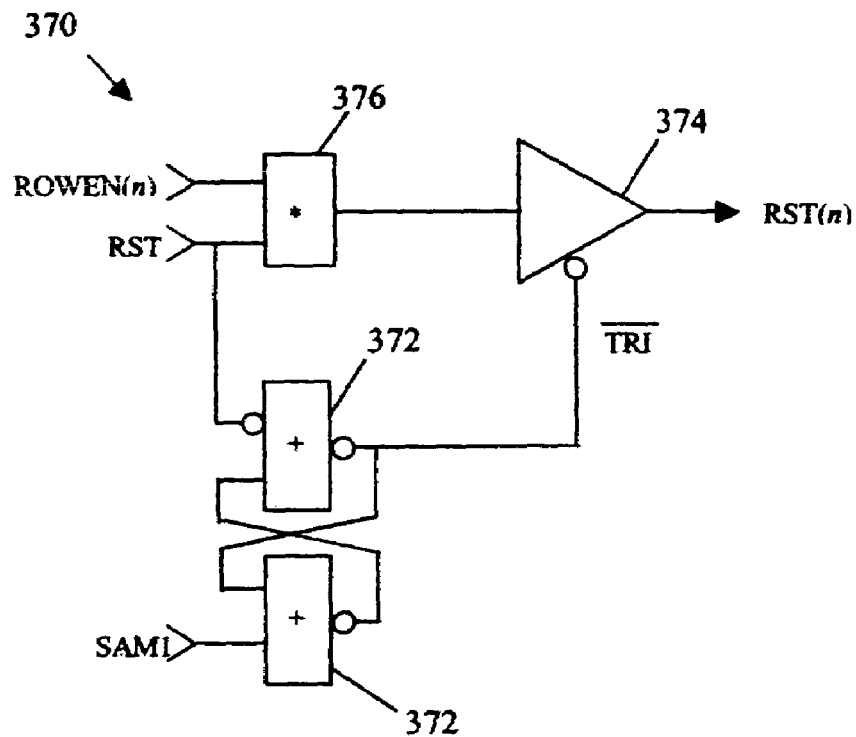
FIG. 12 is a schematic of a logic circuit for generating a RST signal for a row of pixels.
Figure 13:
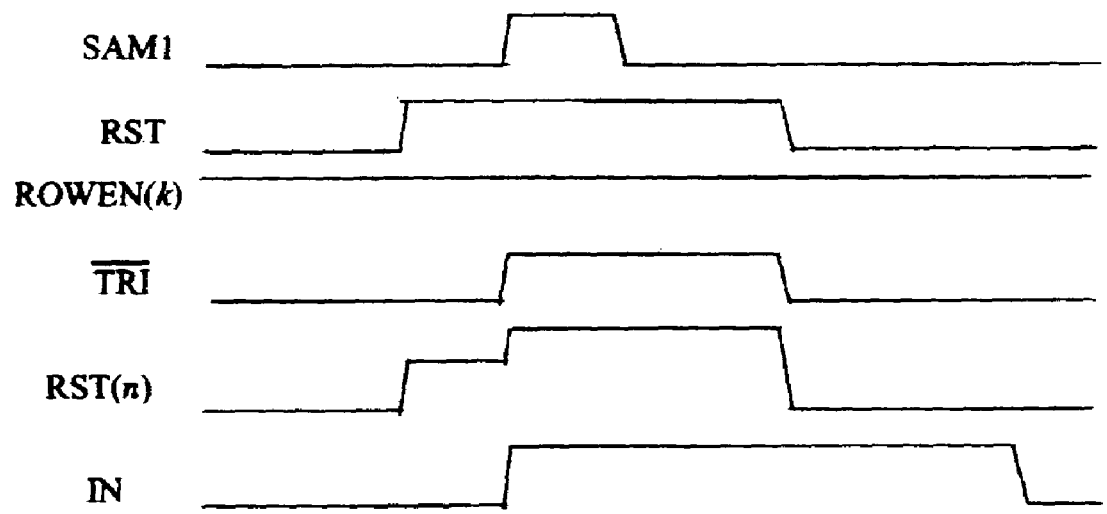
FIG. 13 is a timing diagram for the logic circuit shown in FIG. 12.

The sensor 10 may have a plurality of reset RST(n) drivers 370, each driver 370 being connected to a row of pixels. FIGS. 12 and 13 show an exemplary driver circuit 370 and the operation of the circuit 370. Each driver 370 may have a pair of NOR gates 372 that are connected to the RST and SAM1 latches shown in FIG. 11. The NOR gates control the state of a tri-state buffer 374. The tri-state buffer 374 is connected to the reset transistors in a row of pixels. The input of the tri-state buffer is connected to an AND gate 376 that is connected to the RST latch and a row enable ROWEN(n) line.

Figure 14:
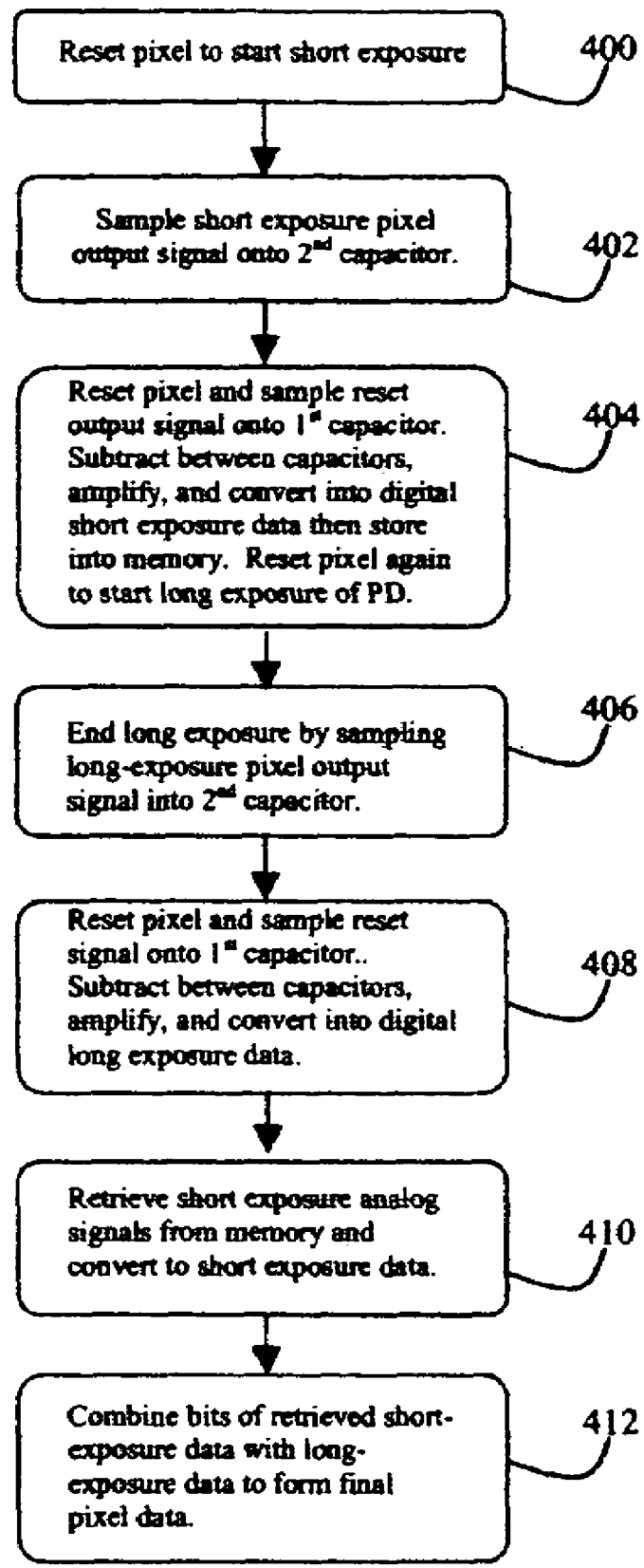
FIG. 14 is a flowchart showing a second mode of operation of the image sensor.
Figure 15:
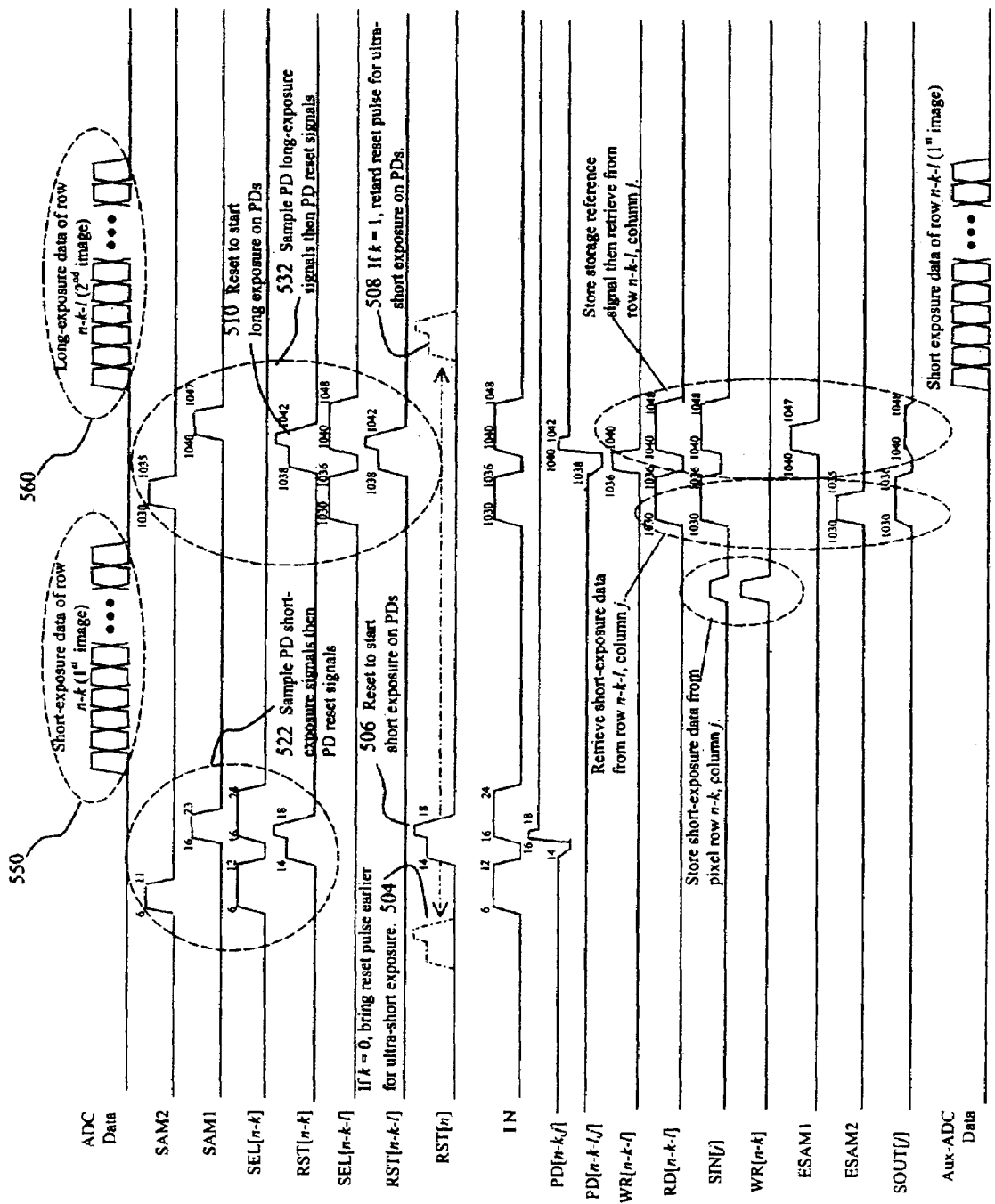
FIG. 15 is a timing diagram for the second mode of operation of the image sensor.

FIGS. 14 and 15 show operation of the image sensor in a second mode also referred to as an extended dynamic range mode. In this mode the image provides a sufficient amount of optical energy so that the SNR is adequate even without the noise cancellation technique described in FIGS. 8 and 9. Although it is to be understood that the noise cancellation technique shown in FIGS. 8 and 9 can be utilized while the image sensor 10 is in the extended dynamic range mode. The extended dynamic mode has both a short exposure period and a long exposure period. Referring to FIG. 12, in block 400 each pixel 14 is reset to start a short exposure period. The mode of the image sensor can be set by an external circuit such as a processor that determines whether the sensor should be in the low noise mode, or the extended dynamic range mode.

In block 402 a short exposure output signal is generated in the selected pixel and stored in the second capacitor 154 of the light reader circuit 16. The level shifted voltage of the photodiode 100 is stored in the first capacitor 152 of the light reader circuit 16 as a reset output signal. In block 404 each pixel is again reset to start a long exposure period.

In block 404 each reset transistor is reset and the short exposure output signal is subtracted from the reset output signal in the light reader circuit 16. The difference between the short exposure signal and the reset signal is converted into a binary bit string by ADC 24. The DAC 28 and storage writer circuit 38 convert M MSB bits of the ADC output into an analog storage signal having one of $2^M$ discrete levels. The short exposure analog signal is stored into memory 36.

In block 406 the light reader circuit 16 stores a long exposure output signal from the pixel in the second capacitor 154.

In block 408 the pixel is reset and the light reader circuit 16 stores the reset output signal in the first capacitor 152. The long exposure output signal is subtracted from the reset output signal, amplified and converted into a binary bit string by ADC 24 as long exposure data.

The storage reader 48 begins to read the short exposure analog signals from memory 36 while the light reader 16 reads the long exposure signals from the pixel array in block 410. The short exposure analog signals are converted into a binary bit string by ADC 52 into short exposure data.

The combiner 56 may append the short exposure data to the long exposure data in block 412. The number of bits from the short exposure data appended to the long exposure data may be dependent upon the exposure times for the long and short exposures. By way of example, $\log_2(l)$ most significant bits (MSB) of the short exposure data may be appended to the long exposure data, where l is the time ratio of long to short exposures. The ratio l should not exceed $2^M-1$ where M is the number of bits to be stored in memory for short exposure data from each pixel. For example, if l is equal to 16 and M is equal to 10 then the retrieved short-exposure data is right-extended with 4 bits of zeros and the long-exposure data left-extended with 4 bits of zeros. The final output is 14 bits and is selected from the left-extended long-exposure data if the value of the long-exposure data is less than 512, otherwise the output is the right-extended short-exposure data. This technique extends the dynamic range by $\log_2(l)$.

FIG. 15 shows the timing of data generation and retrieval for the long and short exposure data. The reading of output signals from the pixel array 12 overlap with the retrieval of signals from memory 36. Short exposure data is retrieved from memory before the long exposure period has ended. FIG. 15 shows timing of data generation and retrieval wherein a n-th row of pixels starts a short exposure, the (n-k)-th row ends the short exposure period and starts the long exposure period, and the (n-k-l)-th row of pixels ends the long exposure period. Where k is the short exposure duration in multiples of the line period, and l is the long exposure duration in multiples of the line period. The short and long exposure output signals are retrieved from the rows of the pixel array in an interleaved manner.

The storage reader circuit 48 and ADC 52 begin to retrieve short exposure data for the pixels in row (n-k-l) at the same time as the (n-k-l)-th pixel array is completing the long exposure period. This shown by the enablement of control signals ESAM1, ESAM2 and RD(n-k-l). At the beginning of a line period, the light reader circuit 16 retrieves the short exposure output signals from the (n-k)-th row of the pixel array 12 as shown by the enablement of signals SAM1, SAM2, SEL(n-k) and RST(n-k). The light reader circuit 16 then retrieves the long exposure data of the (n-k-l)-th row.

The output of the combiner 56 can be provided to an off-board processor such as a DSP (not shown). The processor may first analyze the image with the long exposure data. The photodiodes may be saturated if the image is too bright. This would normally result in a "washed out" image. The processor can process the long exposure data to determine whether the image is washed out, if so, the processor can then use the short exposure image data. The processor can also use both the long and short exposure data to compensate for saturated portions of the detected image.

Although a process is described as performing discrimination between the short and long exposure data, it is to be understood that the combiner 56 may include logic that determines whether to append the short exposure data to the long exposure data. For example, the combiner 56 may append all logic zeros to the long exposure data if the long exposure data is below a threshold.

Although an extended dynamic range mode is described, wherein a short exposure is followed by a long exposure, it is to be understood that the process may include a long exposure-followed by a short exposure. The retrieved long exposure data are left-extended by $\log_2(l)$ bits of zeros and the short exposure data right-extended by $\log_2(l)$ bits of zeros, and the extended long-exposure data replaces the extended short-exposure data if the value of the extended long-exposure data is less than $2^{M-1}$ For Example, assume an exposure ratio of l=16 and M=10, and the $1^{st}$ ADC output is 10 bits. The 10 bit long-exposure data retrieved from memory is left-extended by 4 bits of zeros to make a 14-bit extended long-exposure data. At the same time the 10-bit short exposure data is right-extended by 4 bits of zeros. The 14-bit short-exposure data is then replaced by the 14 bit long-exposure data if the value of the 14-bit long-exposure data is less than 512.

The dual modes of the image sensor 10 can compensate for varying brightness in the image. When the image brightness is low the output signals from the pixels are relatively low. This would normally reduce the SNR of the resultant data provided by the sensor, assuming the average noise is relatively constant. The noise compensation scheme shown in FIGS. 8 and 9 improve the SNR of the output data so that the image sensor provides a quality picture even when the subject image is relatively dark. Conversely, when the subject image is too bright the extended dynamic range mode depicted in FIGS. 12 and 13 compensates for such brightness to provide a quality image.

The signal retrieved by the storage reader 48 may be attenuated from the signal output by DAC 28, causing retrieved data to be smaller than original written data. This can be compensated by making the step size of the DAC 28 larger than the step size of the ADC 52. The step size of the DAC 28 can be varied by adjusting the reference circuit 34.

Figure 16:
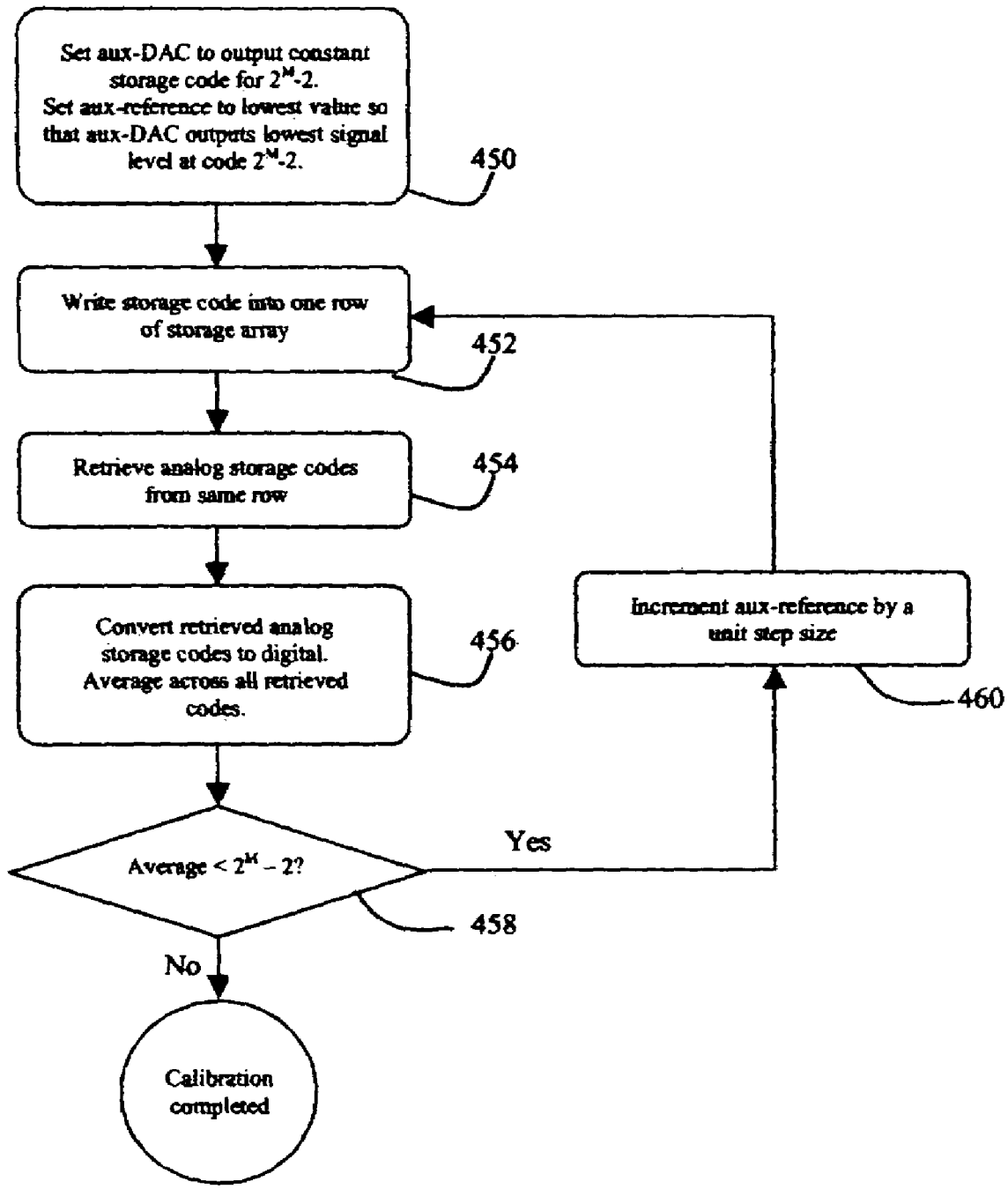
FIG. 16 is a flowchart showing a calibration routine for a digital to analog converter of the image sensor.

FIG. 16 shows a calibration routine for adjusting the DAC 28 during a power up routine. In block 450 the reference circuit 34 is set to the lowest output level so that the $2^M-2$ output of the DAC 28 is at the lowest possible level. The $2^M-2$ output level of the DAC 28 is stored in memory 36 and then retrieved from memory in blocks 452 and 454. The retrieved signals are converted into binary form and then averaged in block 456. The average value is then compared with the $2^M-2$ output of DAC 28 in decision block 458. If the average value is less than $2^M-2$ then the value within the reference 34 is incremented one unit in block 460 and the process is repeated. The process repeats until the average is not less than the $2^M-2$ output wherein the calibration process is completed.

Figure 17:
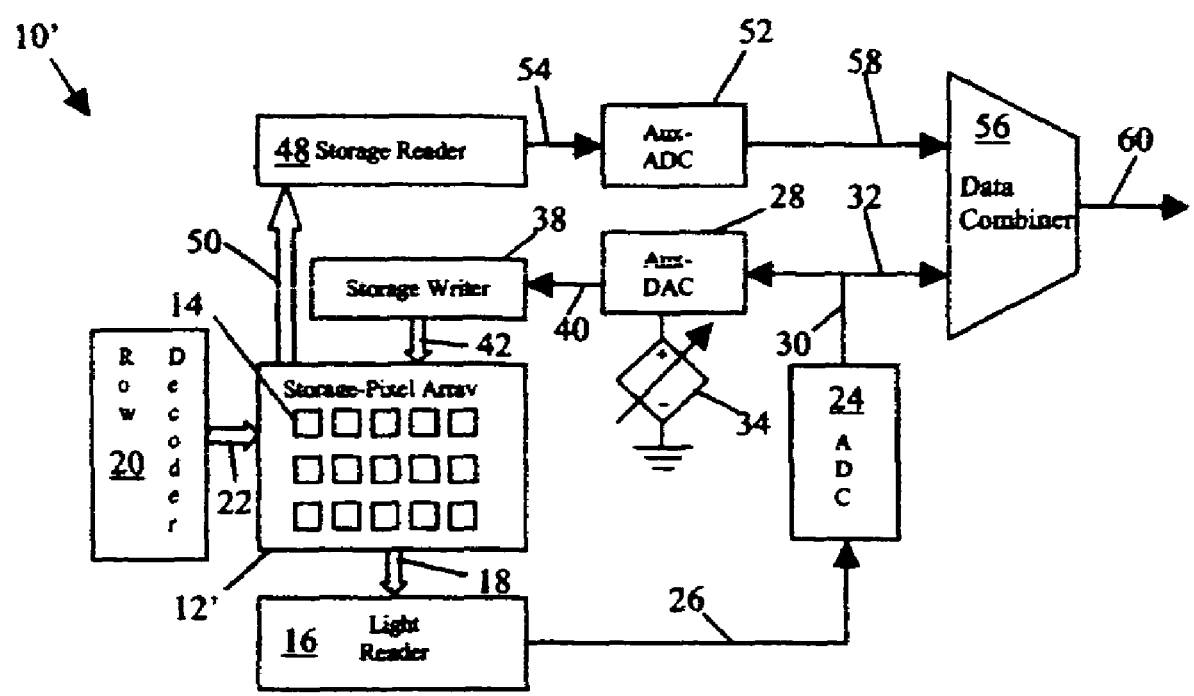
FIG. 17 is a schematic of an alternate embodiment of the image sensor.
Figure 18:
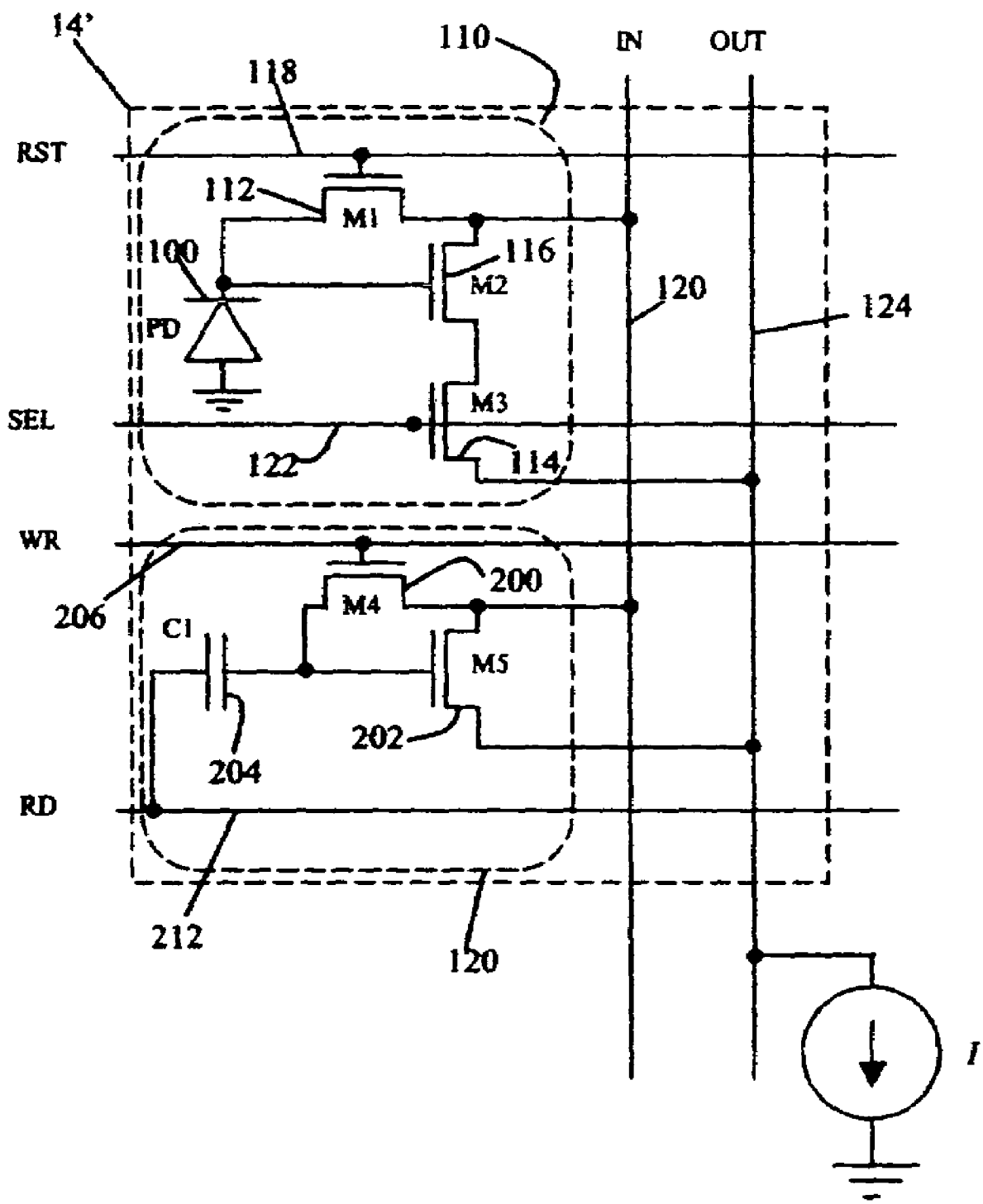
FIG. 18 is a schematic of a pixel of the image sensor shown in FIG. 17.

FIGS. 17 and 18 show an alternate embodiment of an image sensor 10' wherein the memory cells 44 are located within each pixel 14' of the pixel array 12'. The entire sensor 10' may be constructed with CMOS fabrication processes. Such an arrangement may reduce the overall die size of the image sensor 10'. This construction may be undesirable if the inclusion of the memory cells 44 increases the pixel size to an undesirable value.

It is the intention of the inventor that only claims which contain the term "means" shall be construed under 35 U.S.C. §112, sixth paragraph.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

The elements 12, 16, 20, 24, 28, 34, 36, 38, 48, 52 and 56 shown in FIG. 1 may all be integrated onto a single integrated circuit. As alternate embodiments on or more of the elements may be located on a different integrated circuits.

Additionally, the memory 36 may have more or less cells and lines than the pixel array 12. For example, memory may use 3 storage cells per 2 pixels if a storage cell can store 64 levels (8 bits) and a pixel output is 12 bits. Likewise, fewer lines of memory are needed for an image sensor with only the extend dynamic range mode and the short exposure period is subsequent to the long exposure period.

What is claimed is:

1. An image sensor, comprising:
   a photodetector;
   an output transistor having a gate coupled to receive a signal from said photodetector;
   a reset transistor having a drain terminal coupled to reset said photodetector;
   a sample circuit coupled to receive an output signal from said output transistor; and
   a control circuit having a configuration to switch said reset transistor to a triode region such that said output transistor provides a sampled first reference output signal and to subsequently switch said reset transistor to an OFF state such that said output transistor provides a sampled reset output signal that has a voltage different from a voltage of said sampled first reference output signal and a configuration to switch said sample circuit to sample and store said sampled first reference output signal when said reset transistor is in said triode region and to sample and store said sampled reset output signal when said reset transistor is in said OFF state.

2. The image sensor of claim 1, wherein said control circuit has a configuration to switch said output transistor to provide a sampled light response output signal, and to subsequently switch said reset transistor into a triode region such that said output transistor provides a sampled second reference output signal.

3. The image sensor of claim 2, further comprising a capacitor coupled to said output transistor to store said sampled first reference output signal and said sampled second reference output signal.

4. The image sensor of claim 1, wherein said control circuit has a configuration to switch a gate of said reset transistor into a tri-state that lasts at least up to a sampling of said sampled first reference output signal.

5. The image sensor of claim 2, wherein said voltage of said sampled first reference output signal is same as a voltage of said sampled second reference output signal.

6. An image sensor, comprising:
   a photodetector;
   a reset transistor having a drain terminal coupled to reset said photodetector;
   an output transistor having a gate coupled to receive a signal from said photodetector;
   a sample circuit coupled to receive an output signal from said output transistor; and
   control means for switching said reset transistor into triode region so that said output transistor provides a sampled first reference output signal, for switching said reset transistor into an OFF state so that said output transistor provides a sampled reset output signal that has a voltage different from a voltage of said sampled first reference output signal and for directing said sample circuit to sample and store said sampled first reference output signal when said reset transistor is in said triode region and to sample and store said sampled reset output signal when said reset transistor is in said OFF state.

7. The image sensor of claim 6, wherein said control means is also for switching said output transistor to provide a sampled light response output signal and subsequently switching said reset transistor into a triode region such that said output transistor provides a sampled second reference output signal.

8. The image sensor of claim 6, further comprising a capacitor coupled to said output transistor to store said sampled first reference output signal and said sampled second reference output signal.

9. The image sensor of claim 6, wherein said control means is also for switching a gate of said reset transistor into a tri-state that lasts at least up to a sampling of said sampled first reference output signal.

10. The image sensor of claim 7, wherein said voltage of said sampled first reference output signal is same as a voltage of said sampled second reference output signal.

11. A method for generating signals from a pixel of an image sensor, the pixel having a reset transistor and an output transistor having a gate coupled to receive a signal from a photodetector, the reset transistor having a source terminal connected to receive a signal from an IN line and a drain terminal coupled to reset the photodetector, the output transistor being coupled to provide a signal to an OUT line, comprising:
   switching the reset transistor into a triode region, providing a reference signal on the IN line so that an output reference signal is provided on the OUT line;
   sampling said output reference signal while the reset transistor is in the triode region;
   switching the reset transistor to an OFF state;
   sampling a reset output signal provided on the OUT line while the reset transistor is in the OFF state, the reset output signal having a voltage different from a voltage of the output reference signal.

12. The method of claim 11, wherein a gate of the reset transistor is in a tri-state upon the sampling of the output reference signal.

13. The method of claim 12, further comprising:
   providing a predetermined voltage on the IN line prior to the tri-state, the reset transistor in the triode region and having a lesser source-bulk reverse bias than when the reference signal is provided on the IN line.

14. The method of claim 13, wherein a gate voltage of the reset transistor has a change along with and in a same direction as a change of a source voltage of the reset transistor during the tri-state due to a capacitive coupling.

15. The method of claim 14, wherein said capacitive coupling is from a channel of the reset transistor to the gate of the reset transistor.

16. The method of claim 14, wherein said capacitive coupling is from a drain of the reset transistor to the gate of the reset transistor.

17. The method of claim 14, wherein said capacitive coupling is from a source of the reset transistor to the gate of the reset transistor.

18. An image sensor, comprising:
   a photodetector;
   a reset transistor having a drain terminal coupled to reset said photodetector;
   an output transistor having a gate coupled to receive a signal from said drain terminal of said reset transistor, said output transistor configured to output a sampled first reference output signal when said reset transistor is in a triode region and a sampled reset output signal when said reset transistor is in an OFF state; and a sample circuit configured to sample and store said sampled first reference output signal when said reset transistor is in said triode region and to sample and store said sampled reset output signal when said reset transistor is in said OFF state.

19. The image sensor of claim 18, wherein said output transistor is configured to provide a sampled light response output signal while said reset transistor is in an OFF state, and said reset transistor is configured to subsequently switch to a triode region to generate a sampled second reference output signal.

20. The image sensor of claim 18, wherein a gate of said reset transistor is configured to be in a tri-state when said sample circuit samples said sampled first reference output signal.

21. The image sensor of claim 20, wherein said drain terminal is configured to be at a predetermined voltage level prior to said tri-state such that said drain terminal has a drain-bulk reverse bias that is lesser than when said output transistor outputs said sampled first reference output signal.

22. The image sensor of claim 21, wherein a gate voltage of said reset transistor is configured to change along with a drain voltage of said reset transistor in a same direction during said tri-state through a capacitive coupling.

23. The image sensor of claim 22, wherein said reset transistor is configured to remain in said triode region during said change in said drain voltage level.

24. An image sensor, comprising:
a photodetector;
a reset transistor having a drain terminal coupled to reset said photodetector;
an output transistor having a gate coupled to receive a signal from said drain terminal of said reset transistor, said output transistor outputting a sampled first reference output signal when said reset transistor is in a triode region and a sampled reset output signal when said reset transistor is in an OFF state; and
a sample circuit that samples and stores said sampled first reference output signal when said reset transistor is in said triode region and that samples and stores said sampled reset output signal when said reset transistor is in said OFF state.

25. The image sensor of claim 24, wherein said output transistor provides a sampled light response output signal while said reset transistor is in an OFF state, and said reset transistor subsequently switches to a triode region to generate a sampled second reference output signal.

26. The image sensor of claim 24, wherein a gate of said reset transistor is in a tri-state when said sample circuit samples said sampled first reference output signal.

27. The image sensor of claim 26, wherein said drain terminal is at a predetermined voltage level prior to said tri-state such that said drain terminal has a drain-bulk reverse bias that is lesser than when said output transistor outputs said sampled first reference output signal.

28. The image sensor of claim 27, wherein a gate voltage of said reset transistor has a change along with and in a same direction as a change in a drain voltage of said reset transistor during said tri-state due to a capacitive coupling.

29. The image sensor of claim 28, wherein said reset transistor remains in said triode region during said change of said drain voltage.

* * * * *

UNITED STATES PATENT AND TRADEMARK OFFICE
CERTIFICATE OF CORRECTION

| | |
|---|---|
| PATENT NO. | : 7,612,817 B2 |
| APPLICATION NO. | : 10/868407 |
| DATED | : November 3, 2009 |
| INVENTOR(S) | : Hiok Nam Tay |

It is certified that error appears in the above-identified patent and that said Letters Patent is hereby corrected as shown below:

Column 11, lines 19 and 54, column 12, lines 25 and 62, column 13, line 32, and column 14, line 2, for the word "drain", each occurrence, should read --source--.

Column 12, line 24, change "source" to --drain--.

Column 11, line 47, column 12, lines 40, 44 and 50, column 13, lines 15, 20 and 26, and column 14, lines 18, 22 and 28, for the word "tri-state", each occurrence, should read --floating state--.

Signed and Sealed this
Twentieth Day of December, 2011

David J. Kappos
*Director of the United States Patent and Trademark Office*